United States Patent
Liberti et al.

(10) Patent No.: US 11,437,981 B1
(45) Date of Patent: Sep. 6, 2022

(54) TEMPERATURE COMPENSATED AUTO TUNABLE FREQUENCY LOCKED LOOP OSCILLATOR

(71) Applicant: NXP B.V., Eindhoven (NL)

(72) Inventors: Domenico Liberti, San Jose, CA (US); Neil Edward Birns, Cupertino, CA (US); Andre Gunther, San Jose, CA (US); Rob Cosaro, San Jose, CA (US)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 17/218,400

(22) Filed: Mar. 31, 2021

(51) Int. Cl.
*H03K 3/03* (2006.01)
*H03K 3/011* (2006.01)

(52) U.S. Cl.
CPC ........... *H03K 3/0315* (2013.01); *H03K 3/011* (2013.01)

(58) Field of Classification Search
CPC .................................................. H03K 3/0315
USPC ............................................................ 331/57
See application file for complete search history.

(56) References Cited

U.S. PATENT DOCUMENTS

| | | | |
|---|---|---|---|
| 5,257,294 A * | 10/1993 | Pinto | H03L 7/105 375/376 |
| 5,406,228 A * | 4/1995 | Hoang | H03L 7/0995 331/1 A |
| 5,994,967 A | 11/1999 | Nguyen | |
| 6,353,368 B1 | 3/2002 | Iravani | |
| 6,366,175 B2 | 4/2002 | Oka | |
| 6,496,075 B2 | 12/2002 | Justice et al. | |
| 6,614,313 B2 | 9/2003 | Crofts et al. | |
| 8,433,270 B1 | 4/2013 | Demaj et al. | |
| 9,584,133 B2 | 2/2017 | Kratyuk et al. | |
| 10,032,106 B2 | 7/2018 | Entner | |
| 10,250,269 B2 | 4/2019 | Verlinden et al. | |
| 10,461,700 B2 | 10/2019 | Liang et al. | |
| 10,666,235 B1 | 5/2020 | Chou et al. | |

\* cited by examiner

*Primary Examiner* — Joseph Chang

(57) ABSTRACT

A temperature compensated, auto tunable, frequency locked loop oscillator includes, in one embodiment, an oscillator configured to generate a clock-signal with a frequency fclk based on a control voltage vc, and a frequency-to-voltage (f/v) converter coupled to the oscillator, which is configured to generate a first voltage vfb with a magnitude based on frequency fclk. A controller is also included and coupled between the oscillator and the f/v converter. The controller is configured to control the magnitude of the control voltage vc based on the first voltage vfb.

18 Claims, 8 Drawing Sheets

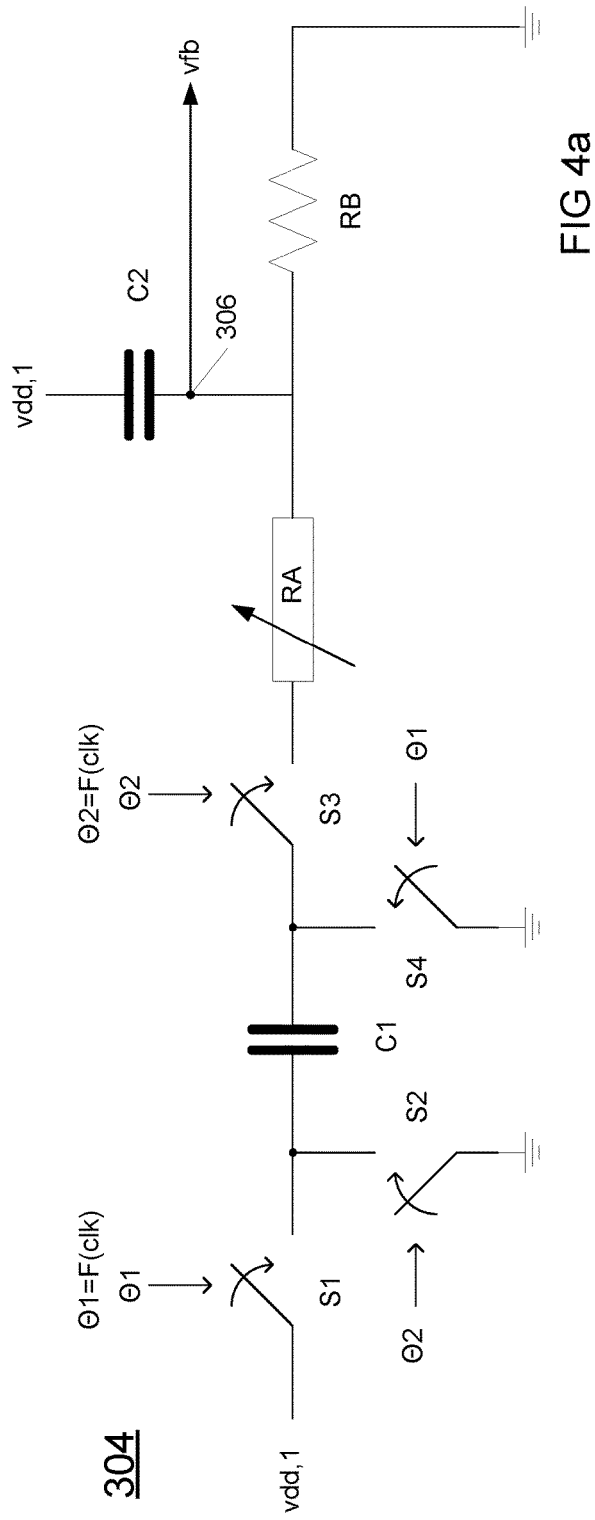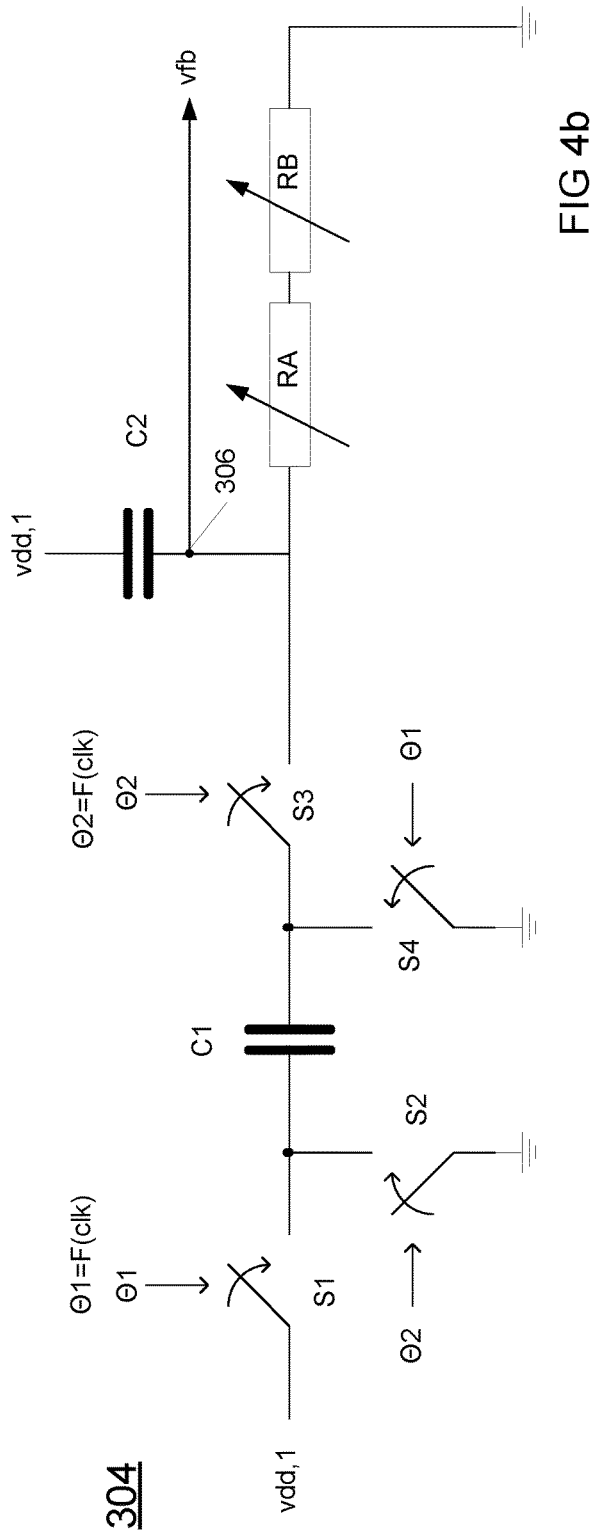

US 11,437,981 B1

TEMPERATURE COMPENSATED AUTO TUNABLE FREQUENCY LOCKED LOOP OSCILLATOR

BACKGROUND

Current-controlled oscillators (CCO) are important building blocks in the design of circuits for electronic signal generation, data processing, data conversion, etc. Many of the existing current-controlled oscillators are based on multi-vibrators or ring oscillators, in which multiple stages of delay elements are included. Logic gates or RC networks are often used as such delay elements. The present disclosure will be described with reference to CCOs that include ring oscillators consisting of an odd number of inverters, it being understood the present disclosure should not be limited thereto.

BRIEF DESCRIPTION OF THE DRAWINGS

The present technology may be better understood, and its numerous objects, features, and advantages made apparent to those skilled in the art by referencing the accompanying drawings.

FIGS. 4a and 4b illustrate alternative embodiments of the variable impedance circuit shown in FIG. 3.

The use of the same reference symbols in different drawings indicates similar or identical items.

DETAILED DESCRIPTION

Figure 1:
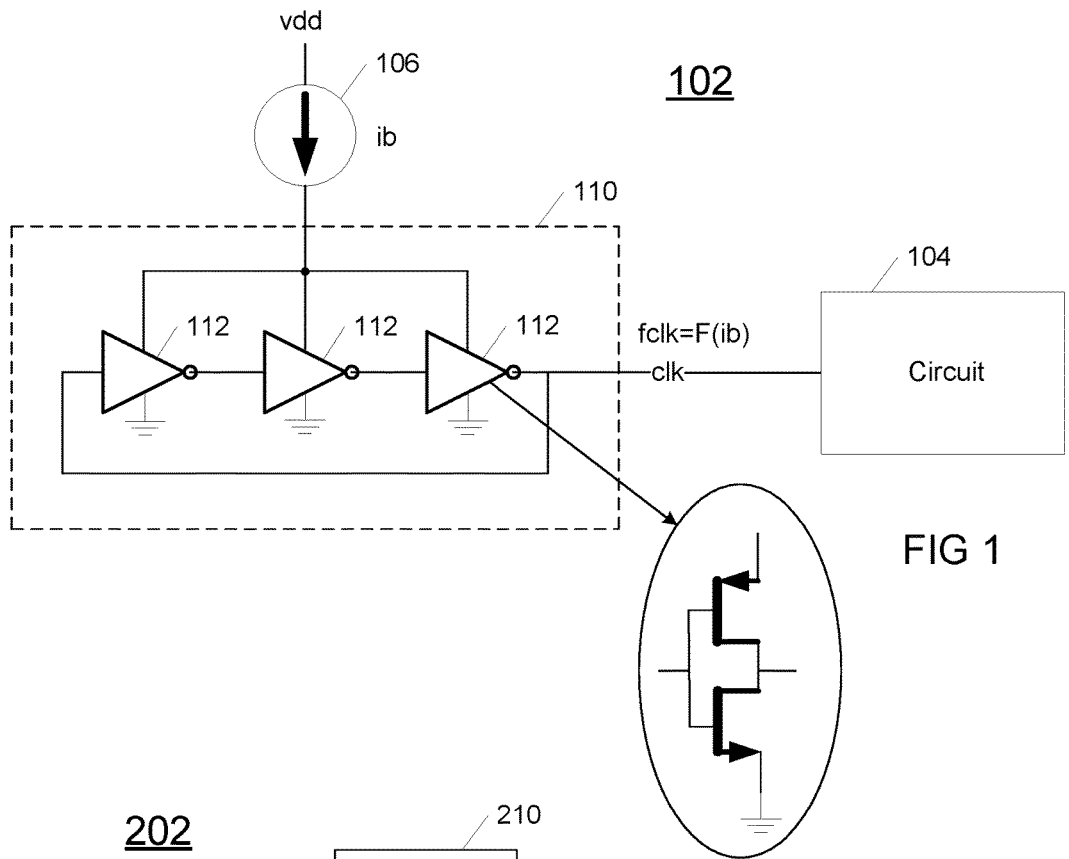
FIG. 1 is a schematic diagram illustrating a CCO.

FIG. 1 is a schematic diagram illustrating a CCO 102 that provides a clock-signal clk to subcircuit 104. CCO 102 includes a variable current source 106 coupled between a supply voltage vdd and ring oscillator 110. As noted, the present disclosure will be described with reference to a CCO that includes a ring oscillator, it being understood that the present disclosure should not be limited thereto.

Ring oscillators, including ring oscillator 110, typically include an odd number of substantially similar inverters connected in a ring. The present disclosure will presume ring oscillators with three or more inverters, even though FIG. 1 shows a ring oscillator 110 having only three inverters 112. The output of the last inverter provides clock-signal clk. The output of the last inverter is also provided as the input of the first inverter of ring 110.

In one embodiment, each inverter 112 includes a P-channel MOSFET connected in series as shown with an N-channel MOSFET. The source of the P-channel MOSFET is connected to variable current source 106, while the source of the N-channel MOSFET is connected to ground. If Tp is the propagation delay of each inverter 112, and N is the number of inverters, the oscillation frequency fclk for clock-signal clk is fclk=1/(2·N·Tp). The bias current ib from variable current source 106 to charge or discharge the capacitance of gates of each of inverters 112 is adjusted in order to change the frequency fclk. The higher the bias current ib, the lower the propagation delay Tp, and the higher the frequency fclk.

One drawback of ring oscillator 110 relates to temperature stability. Assuming that current source 106 is ideal, the frequency drift of ring oscillator 110 with a nominal frequency flck=200 MHz at 27° C., can change with temperature at a rate equal to 0.2 MHz/° C. For a temperature range from −40° C. to 95° C. the overall frequency drift can be ±7%. For some applications this might not be acceptable.

Figure 2:
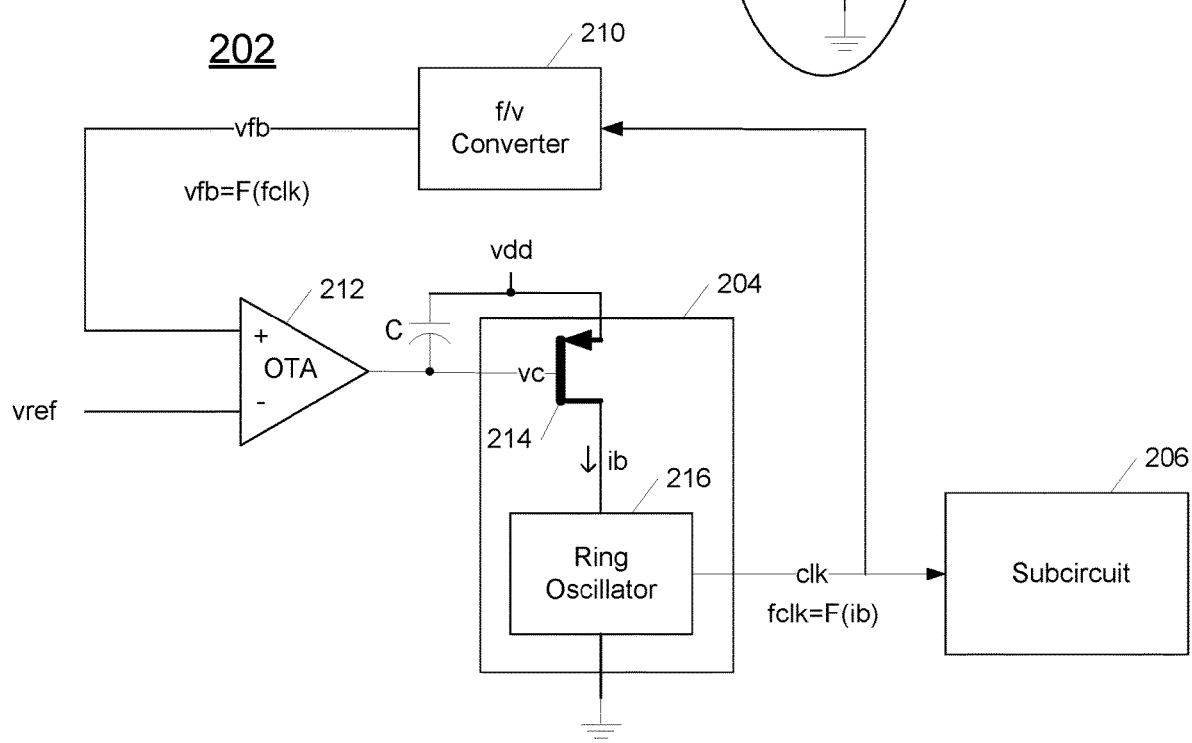
FIG. 2 illustrates a free running oscillator (FRO) based upon a CCO in a Frequency-Locked Loop (FLL).

The present disclosure provides for a free running oscillator (FRO) circuit that addresses this issue and others. In one embodiment the FRO employs a CCO in a FLL. FIG. 2 illustrates a circuit (e.g., a SoC) with an example FRO 202, which in turn includes CCO 204, frequency/voltage (f/v) converter 210 and control circuit 212. CCO 204 generates a clock-signal clk with frequency fclk for sub circuit 206. Clock signal clk is also provided to f/v converter 210. As its name implies, f/v converter 210 converts the frequency fclk of clock-signal clk into feedback voltage vfb. Feedback voltage vfb increases with frequency fclk, and vice versa. The feedback loop is negative, being the only inversion between gate and drain of the PMOS transistor 214.

Control circuit 212 receives feedback voltage vfb and a reference voltage vref. In one embodiment, control circuit 212 takes form in an operational transconductance amplifier (OTA), which is an amplifier that sinks or sources current at its output depending on the polarity of the differential input voltage. Thus, it is a voltage controlled current source (VCCS) with a high impedance differential input stage and a high impedance single ended or fully differential output stage. The OTA can be a single stage amplifier with either a symmetric or folded cascode topology. The higher the OTA gain, the more accurate the frequency regulation, provided that the whole feedback loop is stable. A multistage OTA can also be used in order to increase the gain and thus the accuracy. The dominant feedback loop pole can be positioned at the output of control circuit 212, and its frequency is set by the OTA output impedance and the capacitor C, which, ignoring the gate capacitance of the p-channel MOSFET 214, should be the biggest capacitor in FRO 202. Capacitor C is referenced to vdd in order to improve power supply rejection. In other embodiments it can be referenced to ground. If the temperature dependency of the OTA offset plays a role in the oscillator accuracy, offset compensation techniques can be added around the OTA (e.g., chopping, auto-zeroing). These techniques may require an additional capacitor and switches, driven by two non-overlapping clock phases, to store the offset during the first phase and subtract it from the OTA input during the second phase. Those phases can easily be derived from the clock generated by the FRO.

CCO 204 is controlled by the output of control circuit 212. CCO 204 includes a variable current source 214 coupled to ring oscillator 216, which takes form in a ring of three or more inverters. In the embodiment shown, variable current source 214 takes form in a P-channel MOSFET, it being understood that the present disclosure should not be limited thereto. Control circuit 212 charges or discharges gate capacitance (and other capacitance connected to the gate) of P-channel MOSFET 214 with a current that depends on the difference between vfb and vref. When vfb exceeds vref, control circuit 212 charges the capacitance, which in turn increases control voltage vc. When vref exceeds vfb, control circuit 212 discharges the capacitance, which in turn decreases control voltage vc. Current ib passed by MOSFET 214 increases if vc decreases and vice versa. As noted above, frequency fclk depends on the delay Tp of the inverters in ring oscillator 216, which in turn decreases if bias current ib increases and vice versa.

During operation if frequency fclk drifts towards higher values as a result of a change in temperature, vfb increases. Controller 212 senses the positive difference between vfb and vref, and increases the voltage vc. As a result, the source-to-gate voltage of MOSFET 214 decreases. This causes a decrease in bias current ib provided to ring oscillator 216, which in turn causes fclk to decrease. The process continues until vrb=vref, and the nominal frequency is restored.

Figure 3:
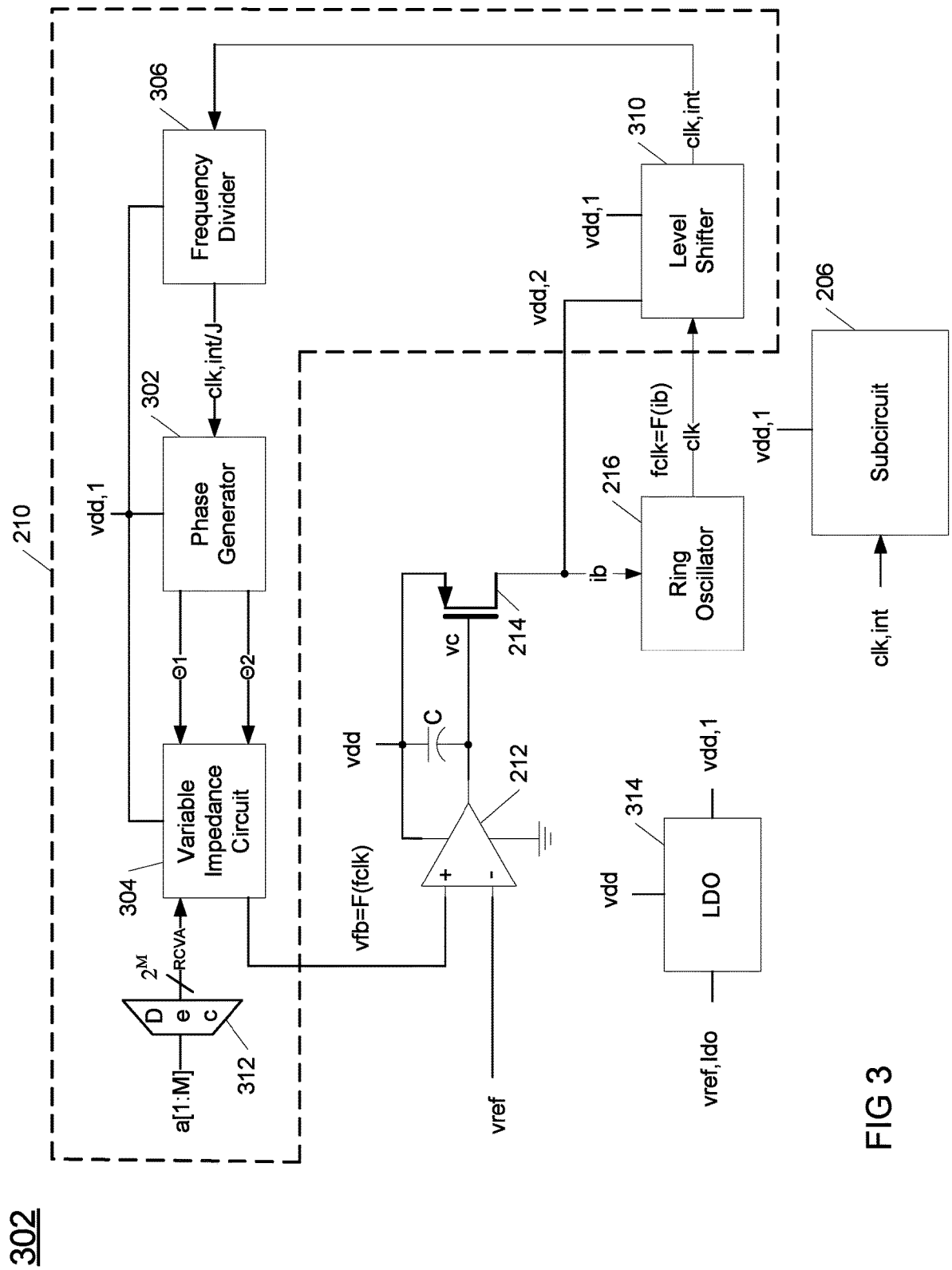
FIG. 3 illustrates one embodiment of the FRO shown in FIG. 2.

FIG. 3 is a schematic diagram that illustrates one embodiment of f/v converter 210. A phase generator 302 is connected between variable impedance circuit 304 and a frequency divider 306. A level shifter 310 receives clock-signal clk from ring oscillator 216. Level shifter 310 shifts clk typically in the range of a threshold voltage, up to vdd,1 level. A low contention level shifter can be used, in order to keep current consumption low. The frequency divider 306 receives the level shifted clock-signal clk,int output from level shifter 310. Level shifted clock clk,int has the same clock frequency flck as clock-signal clk. Frequency divider 306 receives and converts the level shifted clock clk,int to clock-signal clk,int/J with a frequency flck/J where J is an even integer (e.g., 2, 4, 8, 16). Phase generator 302 uses reduced frequency clock clk,int/J to generate a pair of non-overlapping clocks Θ1 and Θ2 with frequency F=fclk/J. A NOR latch with some delay at the output of the two NOR gates can be used, as well as any other circuit capable of generating a two-phase non-overlapping clock.

Variable impedance circuit 304, as its name implies, includes a component whose impedance varies based with frequency F of clocks Θ1 and Θ2 and a value RCVA provided by M-to-$2^M$ decoder 312. Depending upon technology, application and desired accuracy, an M=4 to 8 bit decoder 312 can be used. Variable impedance circuit 304 generates vfb based on frequency F and RCVA. For purposes of explanation, it will be presumed RCVA is constant. In another embodiment, decoder 312 can alter RCVA based on a changing input value a[1:M] provided by a component (e.g., a CPU) that is external to FRO 202, in order to achieve an optimal temperature compensation, as will be explained below.

A low dropout (LDO) regulator 314 provides a supply voltage derived from the external supply vdd and the reference voltage Vref_ldo. Supplies vdd and vdd,1 are distributed to various components of FRO 202 as shown. For purposes of explanation only vdd,1<vdd. Vref_ldo can be a voltage reference from a SoC (e.g. bandgap reference) or derived from vdd with two or more long channel diodes. Although the second solution is simpler and cheaper, it might worsen the power supply rejection of the whole FRO beyond spec limits.

FIGS. 4a and 4b illustrate alternative embodiments of variable impedance circuit 304. Variable impedance circuit 304 in FIG. 4a includes a capacitor C1, capacitor C2 (C2>C1), switches S1-S4, variable resistor RA, and fixed resistor RB. The resistance for RA can be set via RCVA provided by decoder 312. A pole is positioned at the output of the variable impedance circuit 304. The pole is formed with capacitor C2 and the total resistance from the output of variable impedance circuit 304 to ground, including the equivalent resistance of the switched capacitor C1. In order to ensure that the feedback loop is stable with sufficient phase margin, the frequency of such a pole should be adequately higher than the pole located at the OTA output.

First and second switches S1 and S2 are connected to C1 with switch S1 connected between supply voltage vdd,1 and C1 and switch S2 connected to C1 and ground. Switches S1 and S2 are controlled by clocks Θ1 and Θ2, respectively. Third switches S3 and S4 are also connected to capacitor C1, with S3 connected between C1 and variable resistor RA, and S4 connected to C1 and ground as shown. Switches S3 and S4 are controlled by clocks Θ2 and Θ1, respectively. Capacitor C2 is coupled between supply voltage vdd,1 and node 306. In another embodiment capacitor C2 may be coupled between ground and node 306. Resistors RA, RB and the equivalent resistance of the switched capacitor C1 form a resistive divider. Feedback voltage vfb is generated at node 306.

A switched capacitor circuit is formed by the combination of capacitor C1 and switches S1-S4. The switched capacitor circuit acts as a frequency controlled resistor. It should be noted that alternative structures can provide a frequency controlled resistor. Switches S1-S4 should be designed to minimize charge injection and clock feedthrough. Dummy switches can be used to absorb charge trapped in the channels of the switches due to the on-off transition.

The equivalent resistance of the switched capacitor circuit is $R_{EQ}=1/(F\cdot Cs)$ where Cs is the capacitance of C1 and F is the frequency of clocks Θ1 and Θ2. Assuming frequency F changes linearly with temperature T, the equivalent resistance of the switched capacitor circuit is:

$$R_{EQ}(T) = \frac{1}{F_{S0}[1 + K(T - T_0)]C_S}$$

Where:
K=$1^{st}$ order temperature coefficient [1/° C.] for the ring oscillator 216
$F_{S0}$=Ø1 and Ø2 frequency at T=$T_0$ (typically $T_0$=27° C.)
The voltage gain $A_V(T)$ of the circuit 304 is then:

$$A_V(T) = \frac{vfb}{Vdd\_1} = \frac{R_{B0}[1 + TC_B(T - T_0)]}{\frac{1}{F_{S0}[1 + K(T - T_0)]C_S} + R_{A0}[1 + TC_A(T - T_0)] + R_{B0}[1 + TC_B(T - T_0)]}$$

Figure 5:
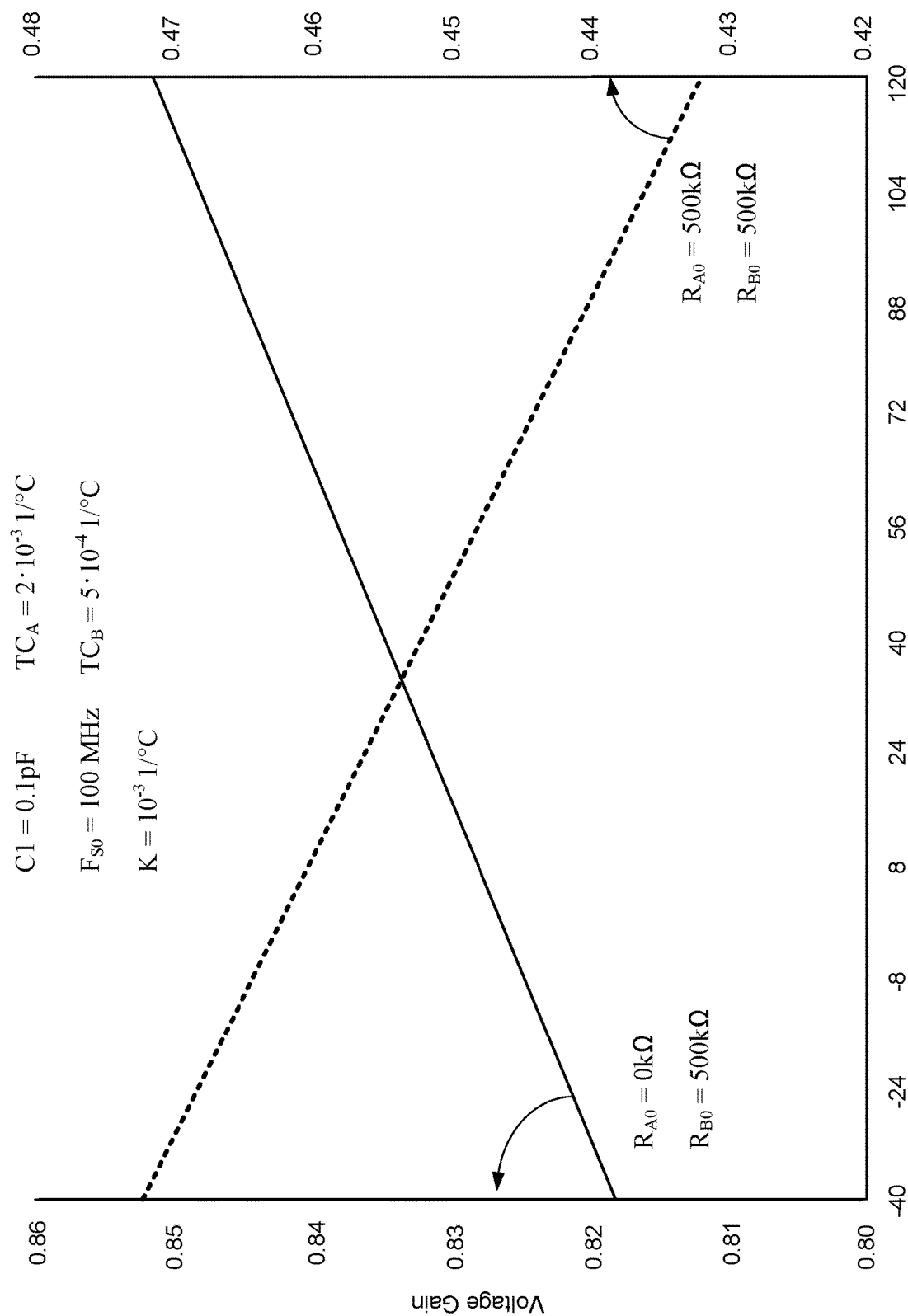
FIG. 5 plots the gain of the variable impedance circuit shown in FIG. 4a versus temperature.

Where:
$TC_A$ and $TC_B$ are $1^{st}$ order temperature coefficients for RA and RB
$R_{A0}$ and $R_{B0}$ are resistances at T=$T_0$ for RA and RB
FIG. 5 plots Gain $A_V$ with temperature for different values of $R_{A0}$, $TC_A>TC_B$ and K>0. If $R_{A0}=R_{B0}$, then the voltage gain slope is negative (dashed curve). If $R_{A0}$=0, then the voltage gain slope is positive (solid curve). The circuit in FIG. 4a allows the frequency-to-voltage converter temperature coefficient to be either positive or negative. Such a feature makes FRO 202 more flexible and adaptable to a variety of ring oscillators, and it is achieved by changing $R_{A0}$. Changes to $R_{A0}$ changes both the frequency-to-voltage converter temperature coefficient and output voltage vfb. Once a desired temperature coefficient is achieved, a re-trim of vref in FIG. 3 may be necessary to set the frequency back to a desired value.

FIG. 4b is an alternative variable impedance circuit 304. FIG. 4b is substantially similar to that shown in FIG. 4a with fixed resistor RB replaced by variable resistor RB. Vfb is generated before the two variable resistors RA and RB. If K<0 (i.e. frequency drops if temperature increases) the arrangement in FIG. 4b can be used. The frequency-to-voltage converter gain $A_V$ for this impedance circuit can be calculated as:

$$A_V(T) = \frac{(R_{A0}[1+TC_A(T-T_0)]+R_{B0}[1+TC_B(T-T_0)])}{\frac{1}{F_{S0}[1+K(T-T_0)]C_S}+R_{A0}[1+TC_A(T-T_0)]+R_{B0}[1+TC_B(T-T_0)]}$$

Figure 6:
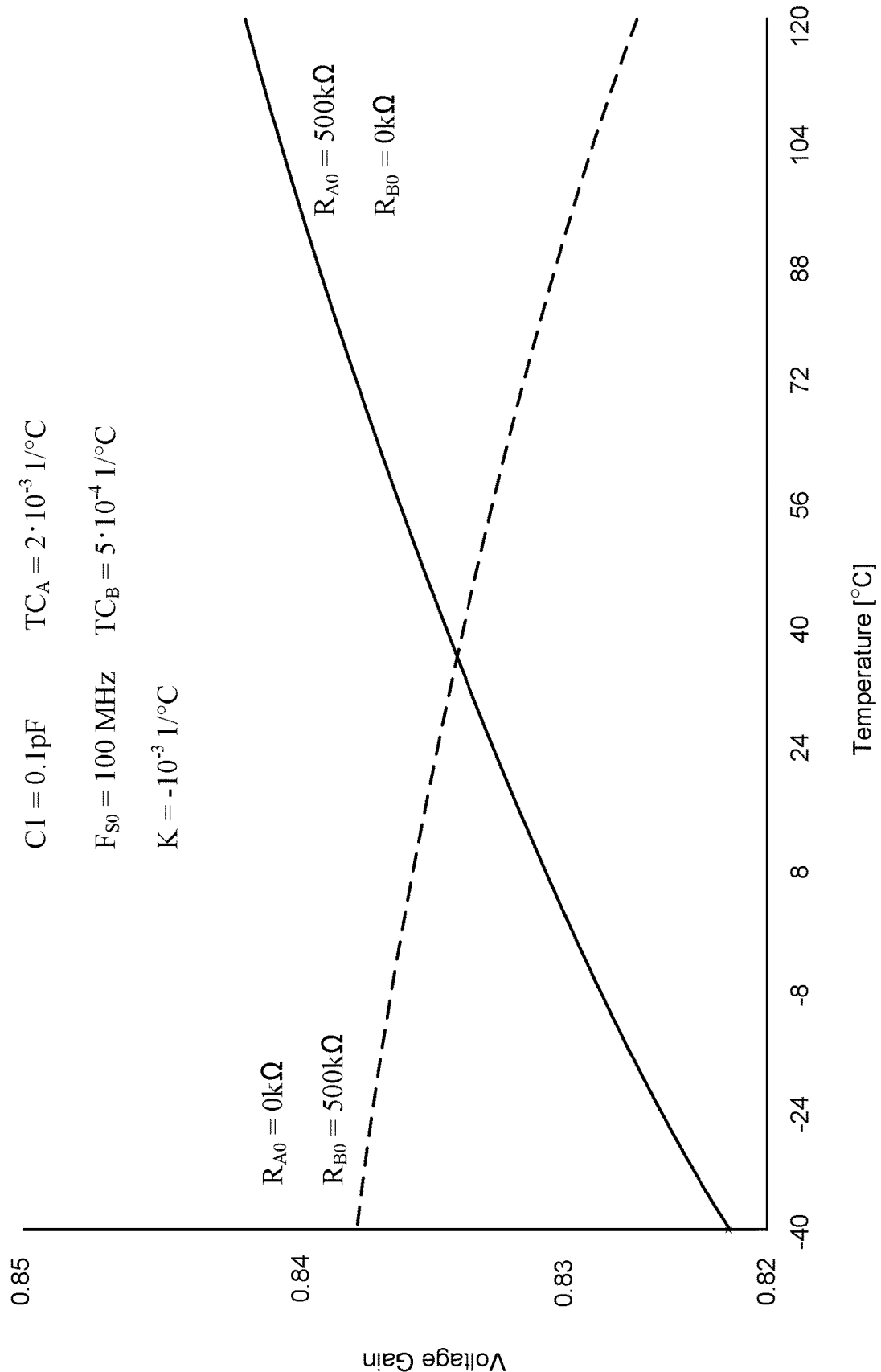
FIG. 6 plots the gain of the variable impedance circuit shown in FIG. 4b versus temperature.

The voltage gain temperature coefficient can be inverted if the resistance of one resistor is greater than that of the other. FIG. 6 plots $A_V$ versus temperature. Since vfb is taken before the two resistors, there's no offset at 27° C. ($R_{A0}$+$R_{B0}$=constant at T=$T_0$). In both arrangements $TC_A$ and $TC_B$ are positive, with $TC_A$>$TC_B$.

The proposed variable impedance circuits in FIGS. 4a and 4b don't need resistors with negative temperature coefficient, which might not be available in a bulk CMOS baseline technology. If K<0 the circuit in FIG. 4a can still be used, provided that RA and RB are swapped. In another embodiment a Sample and Hold circuit can be added at the outputs of the circuits in FIGS. 4a and 4b. This will require an additional capacitor, an additional switch and a third clock phase Ø3 non-overlapping with Ø1 and Ø2.

Figure 7:
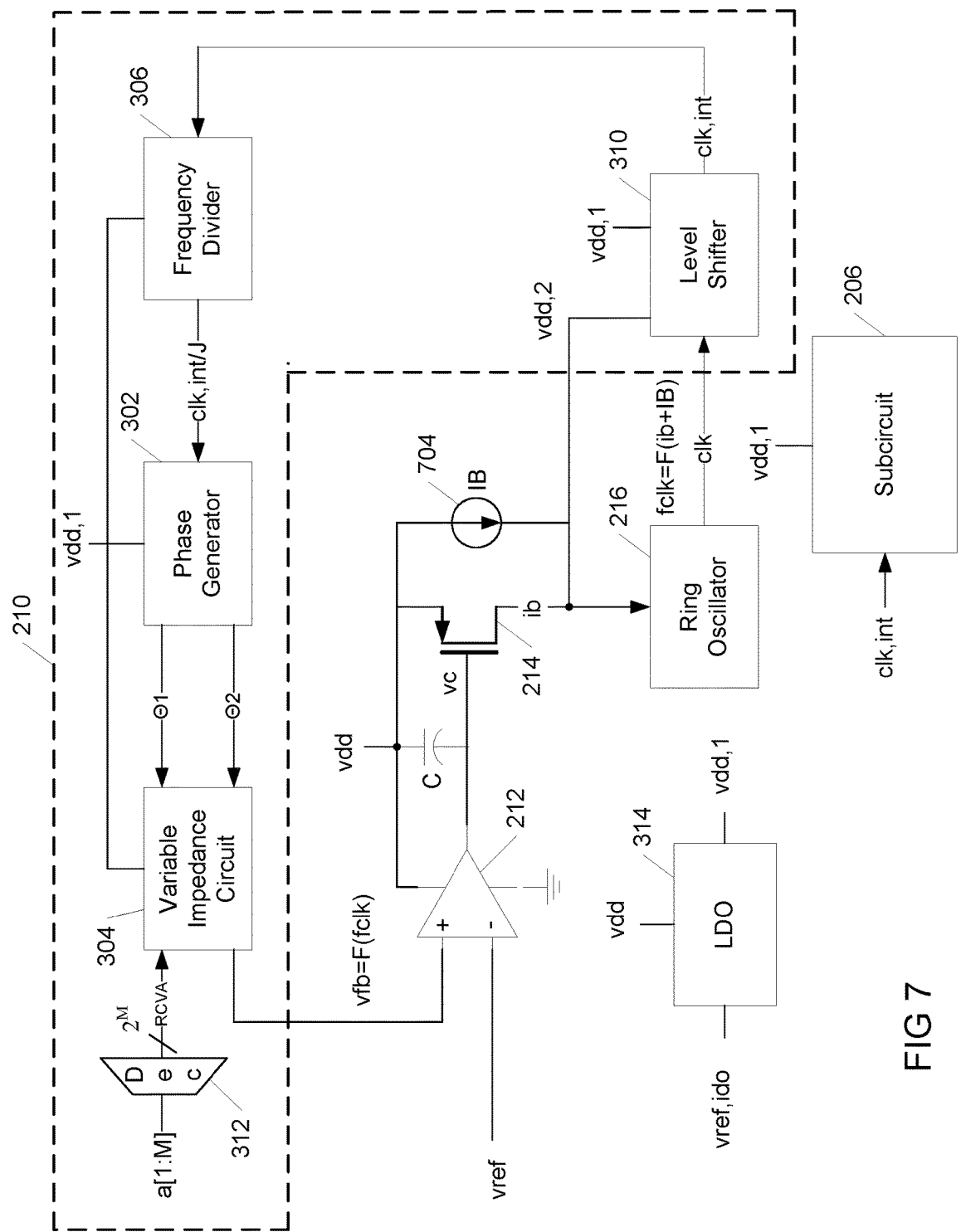
FIG. 7 illustrates another embodiment of the FRO shown in FIG. 2.

FIG. 7 illustrates another FRO 702 according to an alternative embodiment of the present disclosure. FRO 702 is substantially similar to FRO 202 with a fixed current source 704 added as shown. In this embodiment, ring oscillator 216 receives fixed bias current IB from current source 704 and variable bias current ib from MOSFET 214. Fixed bias current IB is provided to start the ring oscillator 216 at power up. Fixed bias current IB can be small (20-25%) relative to variable bias current ib, and can eventually be switched off after power up. However, switching IB off after power up will generate a frequency undershoot, until the regulation loop increases the variable current ib in order to restore the target frequency.

Figure 8:
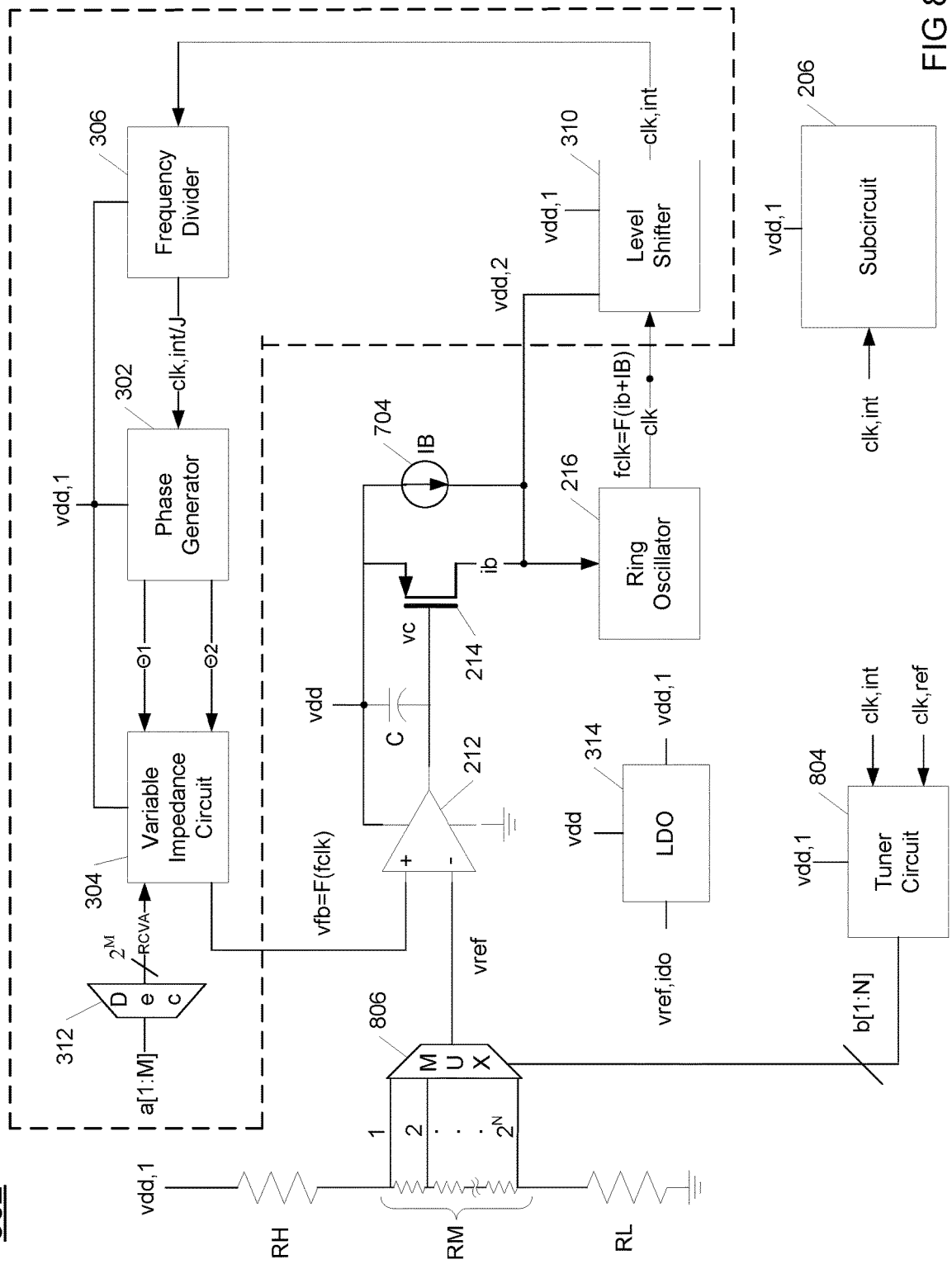
FIG. 8 illustrates yet another one embodiment of the FRO shown in FIG. 2.

FIG. 8 illustrates another FRO 802 according to the present disclosure. FRO 802 is substantially similar to FRO 702 with an added tuner, which provides an adjustable vref to control circuit 212. The tuner includes a tuner circuit 804, a resistive divider that includes resistors RH, RM, RL, and a multiplexer 806. All three resistors can be the same type, with the same temperature coefficient. Resistor RM is segmented and includes $2^N$ leads that are connected to respective inputs of multiplexer 806. RH and RL allows the tuner to maintain vref within the input range of the control circuit 212, while employing the full range of RM. Vref varies based on trim bits b[1:N] provided by tuner circuit 804 and used by multiplexer 806 to select a voltage at one of the $2^N$ leads of the segmented resistor RM. In other words, vref can be set to a desired value based on trim bits b[1:N], which in turn sets fclk.

Tuner circuit 804 uses an accurate reference-clock clk,ref of known frequency (typically a crystal oscillator) to tune clock-signal clk provided by oscillator 216, via vref. Tuning is accomplished by successively incrementing or decrementing trim bits b [1:N], until the frequency fclk is within an acceptable range of the target frequency. The reference-clock clk,ref can be used to establish a measurement period of fixed, known duration. During this period a target counter counts the number of edges of clk,int, and compares this to a upper and low count values around an ideal count value. Adjustments to the trim bits are made when the count falls outside this upper and lower count window. In one embodiment, tuner circuit 804 includes two main counters (not shown). The first can be an 11-bit reference counter clocked by the known, accurate reference-clock clk,ref. The purpose of this counter is simply to establish the fixed measurement duration. The second counter can be a 16-bit target counter clocked by clk,int. Each time a new measurement is triggered, either when FRO 802 is initially enabled or upon subsequent restarts, both counters are enabled. Counting proceeds until the reference counter reaches its maximum count of, for example, 0x7FF. At that point the contents of the target counter are captured in a capture register (not shown). Both counters are then cleared and disabled until the next measurement cycle is launched. The contents of the capture register is compared to a pair of values range_top and range_bottom, which, together, establish a window of approximately 0.05% around an expected target count value (based on the ideal frequency of the clk,int) and the actual, known reference clock frequency clk,ref. The range_top and range_bottom values can be programmed into a control register (not shown). The values to be programmed into these fields can be determined by software executing on a CPU.

If the target counter value captured in the capture register at the end of a given measurement cycle is above the range_top value, the oscillator's the trim bits will be automatically decremented. This will slightly reduce the frequency fclk. If the target counter value captured in the capture register at the end of a given measurement cycle is below the range_bottom value, the trim bits will be incremented to slightly increase frequency fclk. Otherwise the current trim bits will be retained.

At the same time that the capture register is being loaded, a 12-bit restart counter (not shown) can be launched. This counter inserts a programmable delay between successive starts to permit the oscillator time to settle following any update of the trim bits. When this counter times-out a restart signal can be generated which will automatically trigger a new measurement cycle.

When operating normally, the tuner should repeatedly increment or decrement the trim bits until the captured count value falls within the acceptable window (meaning that the frequency is within ±0.1% of its ideal value). After that, only occasional adjustments should be required when/if the frequency fclk drifts due to, for example, oscillator 216 aging. The tuner can be disabled and bits b[1:N] can be provided externally after a proper trim procedure is performed, usually during factory testing of FRO 802.

Figure 9:
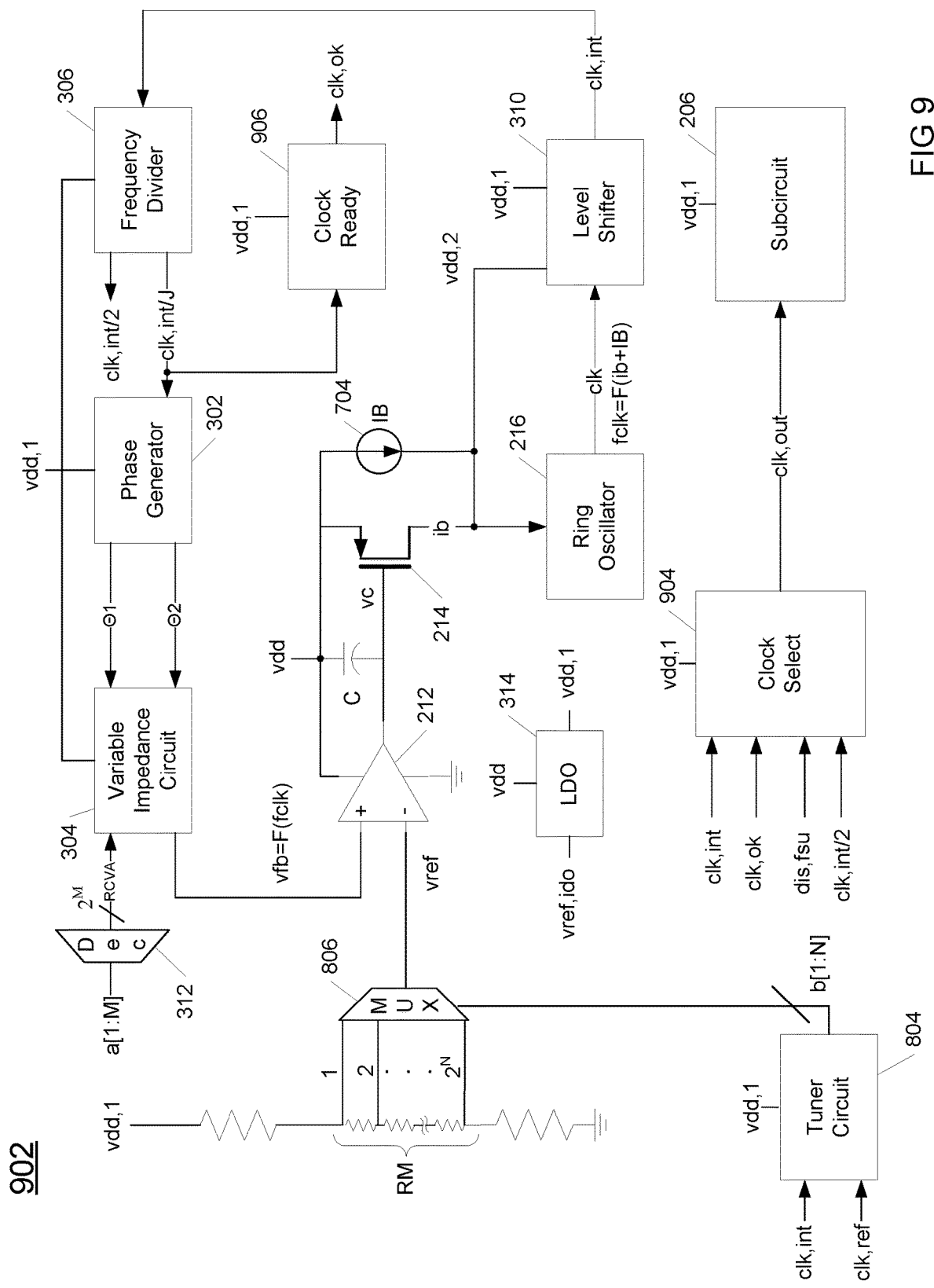
FIG. 9 illustrates still another embodiment of the FRO shown in FIG. 2.

FIG. 9 is still another embodiment of an FRO 902, which includes many of the components of FRO 802. FRO 902 includes a clock select circuit 904 that selects an input clock signal for subcircuit 206. The selected clock signal is provided to subcircuit 206 as clock-signal clk,out. A clock ready circuit 906 monitors divided clock-signal clk,int/J from frequency divider 306. At start up, the frequency of clk,int/J is below its target value. After some time, the frequency reaches the target. Clock ready circuit 906 toggles clk,ok from low to high once the frequency of clk,int is close (i.e. ±10%) to its final value, and in any case lower than the max frequency the logic connected to the FRO can handle. The clock ready circuit can take form in a fixed length counter, whose number of stages is such that clk,ok is asserted when the feedback loop has settled (or close to) and the frequency of clk,int is sufficiently close to its target value. The length of such a counter can be increased in order to get a startup frequency closer to the final value, at the expense of a longer startup time. The clock clk,out is finally passed to the output driver once clk,ok toggles. A synchronization circuit ensures that clk,ok is triggered on the falling edge of clk,int/J, in order to avoid glitches.

Besides signaling when F has reached its target value, clk,ok is also used in the clock select circuit 904, together with clock-signal clk,int, and clk,int/2 provided by frequency divider 306.

With clk,ok low, clk,out=clk,int/2. Such a slower clock can be used to boot the SoC at a lower speed, until the feedback loop has stabilized. During power up, in fact, frequency overshoots may happen since the feedback loop is a multi-pole system and has not yet stabilized. If such overshoots happen on a 50% slower clock, the timing of the digital circuits of subcircuit 206 using that clock is not violated. Once clk,ok finally triggers, then clk,out=clk,int. This allows a shorter startup time without increasing the current consumption. Input dis,fsu to the clock select 904 disables the clock switching between clk,int/2 and clk,int. If dis,fsu is low, then clk,out=clk,int/2 as long as clk,ok is low. When clk,ok toggles from low to high, then clk,out=clk,int. The switching is executed on-the-fly, and no reboot is necessary. Clock select 904 has dedicated circuitry to ensure a glitch-free transition between clk,int/2 and clk,int. If dis,fsu is high, then clk,out=0 until clk,ok toggles from low to high. Once the clk,ok is high, then clk,out=clk,int.

An apparatus is disclosed that includes, in one embodiment, an oscillator configured to generate a clock-signal with a frequency fclk based on a control voltage vc, and a frequency-to-voltage (f/v) converter coupled to the oscillator, which is configured to generate a first voltage vfb with a magnitude based on frequency fclk. A controller is also included and coupled between the oscillator and the f/v converter. The controller is configured to control the magnitude of the control voltage vc based on the first voltage vfb. The f/v converter may include a variable impedance circuit whose impedance depends on frequency fclk. The impedance circuit may include a first switched capacitor circuit coupled to a first supply voltage node, first and second resistors connected in series between the first switched capacitor circuit and a ground node, wherein the first voltage vfb is generated at a node connected to the first resistor. The switched capacitor may include first and second switches coupled in series between the first supply voltage node and the ground node, wherein the first and second switches are controlled by respective non-overlapping clock signals, a first capacitor comprising first and second terminals, wherein the first terminal is coupled to a node between the first and second switches, third and fourth switches controlled by the non-overlapping clock signals, respectively, wherein the third switch is coupled in series between the second terminal of the capacitor and the series coupled first and second resistors, and wherein the fourth switch is coupled between the second terminal of the capacitor and the ground node, wherein frequencies of the non-overlapping clock signals are equal and dependent on frequency fclk. The first resistor may take form in a first variable resistor whose resistance depends on a first input value. The apparatus may further include a frequency divider circuit for generating a divided clock signal with a frequency fclk/2, and a clock select circuit for selecting the divided clock signal or the clock-signal for output based on frequency fclk. In one embodiment, the f/v converter further may include a phase generator for generating the first and second clocks with frequencies based on frequency fclk. The oscillator may include a transistor having a first current terminal coupled to a supply voltage node, a second current terminal coupled to a ring oscillator and a gate, wherein the gate is coupled to an output of the controller and controlled by the control voltage vc, and a ring oscillator coupled between the second current terminal and the ground node. The ring oscillator comprises an odd number of inverters arranged in a ring, wherein an output of the last inverter in the ring is coupled to an input of the first inverter in the ring.

Another apparatus is disclosed that includes a frequency-to-voltage (f/v) converter, which in turn includes first and second switches coupled in series between a first voltage supply node and a ground node, a first capacitor comprising first and second terminals, wherein the first terminal is coupled to a node between the first and second switches, a first resistor, a third switch coupled between the second node of the first capacitor and the first resistor, a fourth switch coupled between the second node of the first capacitor and the ground node, a second resistor coupled between the first resistor and the ground node, a second capacitor comprising first and second terminals coupled to the first voltage supply node and the first resistor, respectively, wherein the first and second switches are controlled by respective non-overlapping clocks having frequency F, wherein the third and fourth switches are controlled by the non-overlapping clocks, respectively, having frequency F, and wherein a voltage generated at the second terminal of the second capacitor will have a magnitude that is proportional to frequency F. In this other apparatus the first resistor includes a first variable resistor whose resistance depends on a first input value. The second terminal of the second capacitor is coupled between the first and second resistors. Or the second resistor comprises a second variable resistor whose resistance depends on a second input value, and the second terminal of the second capacitor is coupled between the third switch and the first resistor. The other apparatus my also include an oscillator configured to generate a clock-signal clk with a frequency fclk based on a control voltage vc at its input, a controller coupled between the oscillator and the f/v converter and configured for controlling the magnitude of the control voltage vc based on the voltage, wherein the frequency F is proportional to frequency fclk. The f/v converter may also include a phase generator for generating the non-overlapping clocks having frequencies based on frequency fclk. The oscillator of the other apparatus may include a transistor comprising a first current terminal coupled to a supply voltage node, a second current terminal, and a gate, and a ring oscillator coupled between the second current terminal and the ground node, wherein the gate is coupled to an output of the controller and controlled by the control voltage. The ring oscillator has three or more inverters arranged in a ring, wherein an output of the last inverter in the ring is coupled to an input of the first inverter in the ring.

A third apparatus is disclosed that includes a multiplexer for selecting one of a plurality of voltages, an oscillator configured to generate a clock-signal clk having a frequency fclk based on a control voltage, a first circuit for generating the control voltage based on the voltage selected by the multiplexer. The third apparatus may also include a second circuit for comparing the frequency fclk with a frequency fref of a reference clock-signal, wherein the second circuit is configured to control the multiplexer based on the comparison between the frequency fclk with frequency fref.

Although the present invention has been described in connection with several embodiments, the invention is not intended to be limited to the specific forms set forth herein.

On the contrary, it is intended to cover such alternatives, modifications, and equivalents as can be reasonably included within the scope of the invention as defined by the appended claims.

What is claimed is:

1. An apparatus comprising:
   an oscillator configured to generate a clock-signal with a frequency fclk based on a control voltage vc;
   a frequency-to-voltage (f/v) converter coupled to the oscillator, and configured to generate a first voltage vfb with a magnitude based on frequency fclk, wherein the f/v converter comprises a variable impedance circuit whose impedance depends on frequency fclk, the variable impedance circuit comprising:
      a first switched capacitor circuit coupled to a first supply voltage node; and
      first and second resistors connected in series between the first switched capacitor circuit and a ground node, wherein the first voltage vfb is generated at a node connected to the first resistor; and
   a controller coupled between the oscillator and the f/v converter and configured to control the magnitude of the control voltage vc based on the first voltage vfb.

2. The apparatus of claim 1 wherein the switched capacitor comprises:
   first and second switches coupled in series between the first supply voltage node and the ground node, wherein the first and second switches are controlled by respective non-overlapping clock signals;
   a first capacitor comprising first and second terminals, wherein the first terminal is coupled to a node between the first and second switches;
   third and fourth switches controlled by the non-overlapping clock signals, respectively, wherein the third switch is coupled in series between the second terminal of the capacitor and the series coupled first and second resistors, and wherein the fourth switch is coupled between the second terminal of the capacitor and the ground node;
   wherein frequencies of the non-overlapping clock signals are equal and dependent on frequency fclk.

3. The apparatus of claim 2 wherein the first resistor comprises a first variable resistor whose resistance depends on a first input value.

4. The apparatus of claim 3 wherein the second resistor comprises a second variable resistor whose resistance depends on a second input value.

5. The apparatus of claim 2 wherein the f/v converter further comprises a phase generator for generating the first and second clocks with frequencies based on frequency fclk.

6. The apparatus of claim 1 wherein the oscillator comprises:
   a transistor comprising a first current terminal coupled to a supply voltage node, a second current terminal coupled to a ring oscillator and a gate, wherein the gate is coupled to an output of the controller and controlled by the control voltage vc;
   a ring oscillator coupled between the second current terminal and the ground node.

7. The apparatus of claim 6 wherein the ring oscillator comprises an odd number of inverters arranged in a ring, wherein an output of the last inverter in the ring is coupled to an input of the first inverter in the ring.

8. An apparatus comprising:
   a frequency-to-voltage (f/v) converter, comprising:
   first and second switches coupled in series between a first voltage supply node and a ground node;
   a first capacitor comprising first and second terminals, wherein the first terminal is coupled to a node between the first and second switches;
   a first resistor;
   a third switch coupled between the second node of the first capacitor and the first resistor;
   a fourth switch coupled between the second node of the first capacitor and the ground node;
   a second resistor coupled between the first resistor and the ground node;
   a second capacitor comprising first and second terminals coupled to the first voltage supply node and the first resistor, respectively;
   wherein the first and second switches are controlled by respective non-overlapping clocks having frequency F;
   wherein the third and fourth switches are controlled by the non-overlapping clocks, respectively, having frequency F;
   wherein a voltage generated at the second terminal of the second capacitor will have a magnitude that is proportional to frequency F.

9. The apparatus of claim 8 wherein the first resistor comprises a first variable resistor whose resistance depends on a first input value.

10. The apparatus of claim 9 wherein the second terminal of the second capacitor is coupled between the first and second resistors.

11. The apparatus of claim 8 wherein the second resistor comprises a second variable resistor whose resistance depends on a second input value.

12. The apparatus of claim 11 wherein the second terminal of the second capacitor is coupled between the third switch and the first resistor.

13. The apparatus of claim 8 further comprising:
   an oscillator configured to generate a clock-signal clk with a frequency fclk based on a control voltage vc at its input;
   a controller coupled between the oscillator and the f/v converter and configured for controlling the magnitude of the control voltage vc based on the voltage;
   wherein the frequency F is proportional to frequency fclk.

14. The apparatus of claim 13 wherein the f/v converter further comprises a phase generator for generating the non-overlapping clocks having frequencies based on frequency fclk.

15. The apparatus of claim 13 wherein the oscillator comprises:
   a transistor comprising a first current terminal coupled to a supply voltage node, a second current terminal, and a gate;
   a ring oscillator coupled between the second current terminal and the ground node;
   wherein the gate is coupled to an output of the controller and controlled by the control voltage.

16. The apparatus of claim 15 wherein the ring oscillator comprises three or more inverters arranged in a ring, wherein an output of the last inverter in the ring is coupled to an input of the first inverter in the ring.

17. An apparatus comprising:
   a multiplexer for selecting one of a plurality of voltages;
   an oscillator configured to generate a clock-signal clk having a frequency fclk based on a control voltage;
   a first circuit for generating the control voltage based on the voltage selected by the multiplexer;
   a second circuit for comparing the frequency fclk with a frequency fref of a reference clock-signal;

wherein the second circuit is configured to control the multiplexer based on the comparison between the frequency fclk with frequency fref.

18. The apparatus of claim 17 further comprising:
a frequency divider circuit for generating a divided clock signal having a frequency fclk/N, wherein N is an integer greater than one;
a clock select circuit for selecting the divided clock signal or the clock-signal for output based on frequency fclk.

* * * * *